United States Patent [19]

Namba et al.

[11] Patent Number: 4,584,053
[45] Date of Patent: Apr. 22, 1986

[54] PROCESS FOR PREPARING ZNSE SINGLE CRYSTAL

[75] Inventors: Hirokuni Namba; Hajime Osaka; Koichi Kamon; Fuminori Higuchi, all of Osaka, Japan

[73] Assignee: Sumitomo Electric Industries, Ltd., Osaka, Japan

[21] Appl. No.: 623,115

[22] Filed: Jun. 22, 1984

[30] Foreign Application Priority Data

Jun. 29, 1983 [JP] Japan .................................. 58-119406

[51] Int. Cl.⁴ .............................................. C30B 1/12
[52] U.S. Cl. .......................... 156/603; 156/DIG. 72; 156/DIG. 73; 156/DIG. 77; 423/509
[58] Field of Search ....... 156/603, DIG. 72, DIG. 73, 156/DIG. 77; 148/404; 423/509

[56] References Cited

U.S. PATENT DOCUMENTS 3,146,204  8/1964  Aven ........................... 156/DIG. 72
4,465,546  8/1984  Fitzpatrick et al. ......... 156/DIG. 72

FOREIGN PATENT DOCUMENTS 132046  10/1980  Japan .................................. 156/603
 17411   1/1982  Japan .................................. 423/509
 51103   3/1982  Japan .................................. 423/509
106507   7/1982  Japan .................................. 423/509

Primary Examiner—David L. Lacey
Attorney, Agent, or Firm—Wenderoth, Lind & Ponack

[57] ABSTRACT

A process for preparing a large ZnSe single crystal, comprising vacuum sealing polycrystalline ZnSe prepared by a chemical vapor deposition in a capable and hot isostatically pressing polycrystalline ZnSe in the capsule, by which the ZnSe single crystal having such high qualities as to be used as a substrate on which an epitaxial layer of ZnSe can be grown.

4 Claims, 1 Drawing Figure

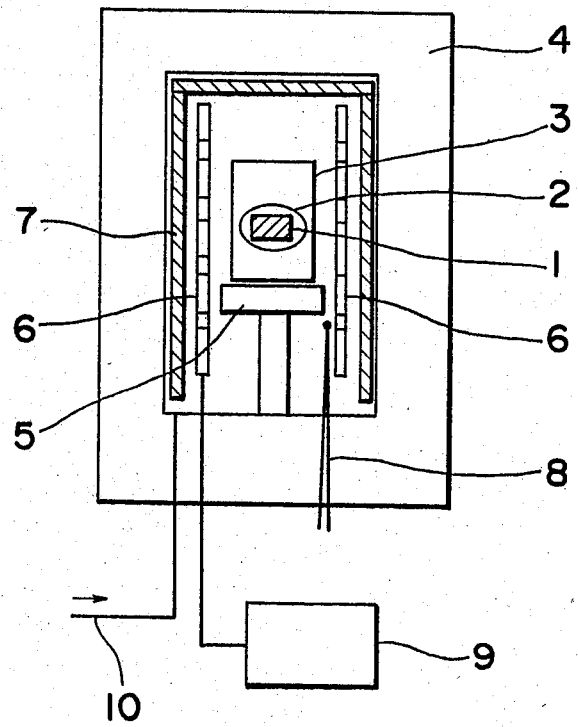

PROCESS FOR PREPARING ZNSE SINGLE CRYSTAL

FIELD OF THE INVENTION

The present invention relates to a process for preparing a ZnSe single crystal. More particularly, it relates to a process for preparing a large ZnSe single crystal having high qualities.

BACKGROUND OF THE INVENTION

A ZnSe single crystal is expected to be used, for example, as a blue light emitting diode. However, conventional ZnSe single crystals are neither large nor of high quality to be used as such diode. A ZnSe single crystal prepared by chemical vapor deposition tends to have crystal defects such as the formation of twin crystals and are not large enough. A ZnSe single crystal prepared by the Bridgman method also tends to have crystal defects such as bubbles, twin crystals and compositional deviations.

In order to grow an epitaxial layer of ZnSe on a substrate, a single crystal of a different material having a similar lattice constant such as GaAs, GaP and Ge is used as the substrate, but an epitaxial layer possessing high qualities cannot be prepared due to the difference between the lattice constants of the ZnSe and the substrate.

SUMMARY OF THE INVENTION

One object of the invention is to provide a large ZnSe single crystal having less crystal defects and compositional deviations, than conventional ZnSe crystals.

Another object of the invention is to provide a process for preparing a large ZnSe single crystal having such high quality as to be used as a substrate on which an epitaxial layer is grown, which process comprises vacuum sealing polycrystalline ZnSe prepared by a chemical vapor deposition in a capsule and subjecting the polycrystalline ZnSe to a hot isostatic pressing in the capsule.

BRIEF DESCRIPTION OF THE DRAWING

The FIGURE is a cross-sectional schematic view of an apparatus for high isostatic pressing.

DETAILED DESCRIPTION OF THE DRAWING

Firstly, polycrystalline ZnSe is synthesized by the conventional chemical vapor deposition (hereinafter referred to as "CVD"). CVD comprises charging Zn vapor and gaseous $H_2Se$ in a tubular reactor having a suitable temperature distribution and reacting Zn and $H_2Se$ to form polycrystalline ZnSe on a substrate.

The thus prepared polycrystalline ZnSe is then treated in an apparatus for hot isostatic pressing (hereinafter referred to as "HIP") as shown in the FIGURE.

Polycrystalline ZnSe 1 is vacuum sealed in a capsule 2 and placed in a container 3. The container 3 serves to make the temperature distribution in the capsule homogeneous and has a hole (not shown) through which interior gas is exchanged with exterior gas. The container 3 is made, for example, of carbon. The container 3 is placed on a supporting bed 5 in a pressure container 4 and heated with a heater 6. Numerals 7, 8 and 9 denote a thermal insulator, a thermister which monitors the temperature in the apparatus and a power source for the heater, respectively.

The capsule 2 is usually made of heat-resistant glass such as fused silica and Pyrex (trade mark) glass. The pressure container 4 should be able to withstand a high pressure of 2,000 atm or higher. The pressure is raised by supplying high pressure argon gas through a tube 10 for supplying argon gas.

HIP is carried out at a temperature of at least 1,000° C., preferably from 1,000° to 1,200° C., more preferably from 1,000° to 1,1000° C. The pressure in the pressure container 4 is at least 2,000 atm, preferably from 2,000 to 2,300 atm, more preferably from 2,000 to 2,100 atm. When the temperature is lower than 1,000° C., polycrystalline ZnSe is not transformed to the single crystal even if the pressure is higher than 2,000 atm. When the pressure is lower than 2,000 atm, polycrystalline ZnSe is not transformed to a single crystal either, even if the temperature is higher than 1,000° C. Usually, the HIP treatment time varies with other conditions such as the temperature and the pressure and usually is at least two hours.

According to the process of the invention, polycrystalline ZnSe is transformed to the large single crystal having less crystal defects and compositional deviation. The size of the single crystal prepared by the process of the invention varies with the size of the apparatus used and is usually from 10 to 75 mm in diameter.

The present invention will be hereinafter explained further in detail by following examples.

EXAMPLE

Used polycrystalline ZnSe was prepared by CVD and had a diameter of 50 mm and a weight of 50 g. It was hot isostatically pressed by the apparatus shown in FIGURE at a pressure of 2,000 atm at a predetermined temperature and for predetermined period of time. The crystalline growth was observed and evaluated according to the following criteria:

x: Not crystallized
Δ: Partially crystallized
0: Crystallized

The results are shown in Table.

TABLE

| Treating time (hr) | Temperature (°C.) | | |
|---|---|---|---|
| | 900 | 950 | 1,000 |
| 1 | x | x | Δ |
| 2 | x | Δ | 0 |
| 3 | x | Δ | 0 |

From the results shown in Table, it is understood that, at 950° C., single crystal is not grown after a longer treating time and, at 1,000° C., the treating time shorter than one hour does not afford a single crystal. Thus, HIP is preferably effected at a temperature of at least 1,000° C. for at least two hours.

For comparison, the above procedures were repeated with using a sintered ZnSe powder in place of polycrystalline ZnSe prepared by a CVD method. The thus prepared single crystal had many crystal defects including powder and bubbles and was not suitable for a substrate on which the epitaxial layer is grown.

What is claimed is:

1. A process for preparing a large ZnSe single crystal, comprising vacuum sealing polycrystalline ZnSe prepared by a chemical vapor phase deposition in a capsule and hot isostatically pressing the polycrystalline ZnSe in the capsule at a temperature of at least 1,000° C. and a pressure of at least 2,000 atm for at least one hour.

2. A process according to claim 1, wherein the polycrystalline ZnSe in the capsule is hot isostatically pressed at a temperature of from 1,000° to 1,200° C. and a pressure of from 2,000 to 2,300 atm.

3. A process according to claim 1, wherein the polycrystalline ZnSe in the capsule is hot isostatically pressed at 1,000° C. and 2,000 atm for two hours.

4. A process according to claim 1, wherein the capsule is made of heat-resistant glass.

* * * * *